(12) United States Patent
Duerk et al.

(10) Patent No.: US 8,030,919 B2
(45) Date of Patent: Oct. 4, 2011

(54) DARK BLOOD BALANCED STEADY STATE FREE PRECESSION IMAGING

(75) Inventors: Jeffrey L. Duerk, Avon Lake, OH (US); Jeffrey L. Sunshine, Pepper Pike, OH (US); Mark A. Griswold, Shaker Heights, OH (US); Jamal J. Derakhshan, Cleveland Heights, OH (US); Sherif G. Nour, Highland Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 234 days.

(21) Appl. No.: 12/423,941

(22) Filed: Apr. 15, 2009

(65) Prior Publication Data
US 2009/0261825 A1   Oct. 22, 2009

Related U.S. Application Data

(60) Provisional application No. 61/124,726, filed on Apr. 18, 2008.

(51) Int. Cl.
*G01V 3/00* (2006.01)

(52) U.S. Cl. .................................. 324/306; 324/309
(58) Field of Classification Search .................. 324/306, 324/309
See application file for complete search history.

(56) References Cited

U.S. PATENT DOCUMENTS

| 4,609,872 | A * | 9/1986 | O'Donnell | 324/306 |
| 7,208,950 | B2 * | 4/2007 | Deimling | 324/309 |
| 2009/0315559 | A1 * | 12/2009 | Herzka et al. | 324/309 |

* cited by examiner

*Primary Examiner* — Louis Arana
(74) *Attorney, Agent, or Firm* — Kraguljac & Kalnay, LLC

(57) ABSTRACT

Systems, methods, and other embodiments associated with controlling a magnetic resonance imaging (MRI) apparatus to perform a balanced steady state free precession (bSSFP) technique that includes magnetization preparation with differentiated velocity encoding and spoiling residual transverse magnetization are described. The example systems, methods, and other embodiments are also associated with acquiring a dark blood image in response to the bSSFP technique. A dark blood image is one in which NMR signal acquired from an object subjected to the bSSFP technique and magnetization preparation includes NMR signal from flowing spins and NMR signal from non-flowing spins in a desired ratio.

18 Claims, 11 Drawing Sheets

DARK BLOOD BALANCED STEADY STATE FREE PRECESSION IMAGING

PRIORITY CLAIM

This application claims the benefit of U.S. Provisional Application 61/124,726 filed Apr. 18, 2008, titled Dark Blood Balanced Steady State Free Precession Imaging, by the same inventors.

BACKGROUND

One type of magnetic resonance imaging (MRI) pulse sequence is referred to as balanced steady state free precession (bSSFP) MRI. bSSFP may also be referred to as True-FISP (True Fast Imaging with Steady-state Precession). MRI involves applying radio frequency (RF) energy to an object according to carefully crafted pulse sequences in the presence of a carefully crafted magnetic field. When the object is a human body, the RF energy may be applied to tissues that are not moving (e.g., femur), tissues that are moving (e.g., heart muscle), and to the blood in the body. Since all of these parts of the body may be excited by the RF energy, all of these parts may emit nuclear magnetic resonance (NMR) signal from which an image may be reconstructed. While at times it may be desirable to acquire signal from all these parts, at other times it may be undesirable.

Flowing blood appears hyperintense in bSSFP magnetic resonance (MR) images. The hyperintense blood may be referred to as "bright blood". The hyperintensity may be due, at least in part, to inflowing fresh magnetization, to refocusing of spins that have left an imaging slice. Bright blood may be useful at times. However, bright blood can hinder certain applications. For example, bright blood may hinder examining blood vessel walls. Bright blood can also cause artifacts in images. These artifacts may compromise image quality, may obscure underlying pathology, and so on. Thus, some conventional approaches for obtaining dark blood (DB) bSSFP images have been developed. These approaches typically lengthen the repetition time (TR) in a pulse sequence and thus lengthen overall imaging time. This can increase discomfort for a patient, reduce the number of patients that can be seen in a day, increase the likelihood that a patient will move during a scan, and so on. Thus, in general it is desirable to reduce imaging time, not to increase it. However, in some conventional approaches, TR has been lengthened to more than 11 ms. This lengthy TR both increases scan time and exacerbates banding artifacts that may be associated, for example, with accumulated phase.

Conventional TrueFISP is a coherent imaging technique. TrueFISP employs a fully balanced gradient waveform. Image contrast typically depends primarily on TR but is determined by T2*/T1 properties (or T2/T1 around TE=TR/2). T1 weighting in TrueFISP is impractical due to ever shortening TR times associated with steady state precession techniques. TrueFISP builds on FISP (fast imaging with steady state precession). FISP combines separately observed signals. But for a missing spoiler gradient pulse and RF spoiling, a FISP sequence is similar to a FLASH (fast low-angle shot) sequence. Since the spoiler pulse is missing, there may be transverse magnetization present when the next RF pulse is added to the steady state. FISP has an alternating sign RF pulse. This may be labeled in pulse sequence diagrams as α and −α (see, for example, FIG. 1). This facilitates making image contrast practically independent of T1.

Diffusion-prepared (DP) bSSFP was proposed for vessel wall imaging. See, for example, Koktzoglou I, Li D. *JCMR* 2007, 9(1):33-42. The diffusion-prepared bSSFP appears to have used a unipolar gradient. Building on this work, in January of 2009, after the priority date of this application, Zhaoyang Fan, Debiao Li, et al described 3D peripheral subtraction MRA using flow-spoiled ECG-triggered balanced SSFP, in *Journal of Cardiovascular Magnetic Resonance* 2009, 11(Suppl 1):P288, doi:10.1186/1532-429X-11-S1-P288. In the January 2009 technique, the Koktzoglou DP module was modified by using bipolar gradient rather than unipolar gradient. The bipolar gradient was applied both before and after a central 180 degree RF pulse to address artifacts resulting from an imperfect frequency response. FIG. 11 illustrates the Fan-Li, et al modified flow-sensitizing dephasing (FSD) preparation. Note that spoiling only occurs once per FSD preparation, after the $-90°_x$ pulse.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example systems and methods provide dark blood balanced steady state free precession (DBbSSFP) magnetic resonance imaging (MRI). Example systems and methods adapt conventional steady state free precession (e.g., TrueFISP) by preparing magnetization by periodically applying bipolar velocity encoding gradients on different axes and by spoiling residual transverse magnetization. In one example, bSSFP magnetization is periodically stored along the z-axis using an α/2 pulse.

Figure 1:
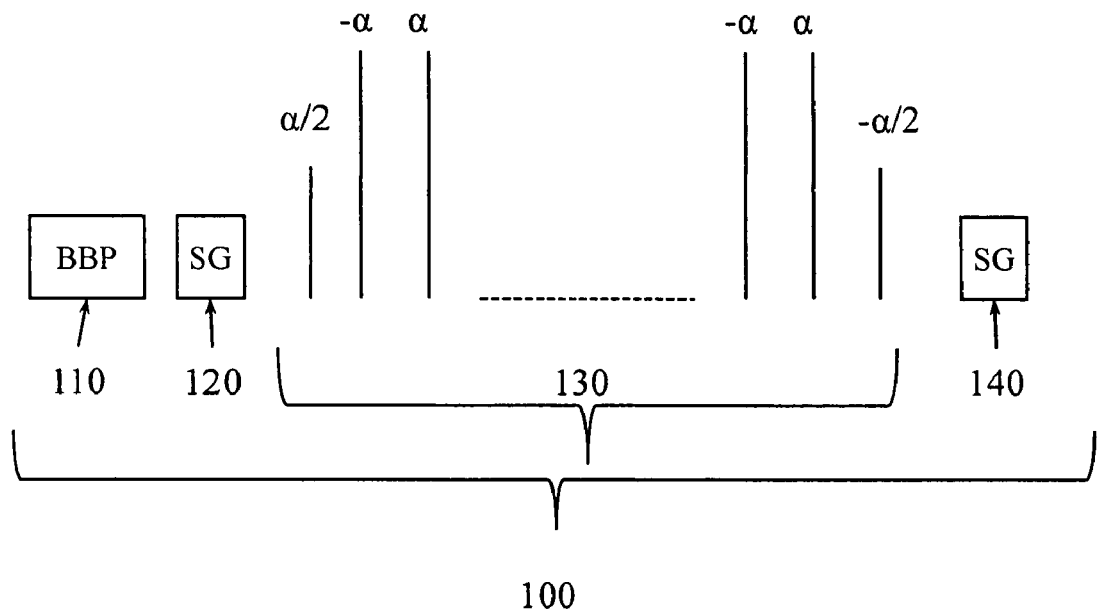
FIG. 1 illustrates one example TR of a dark blood (DB) bSSFP (DBbSSFP) sequence.
Figure 10:
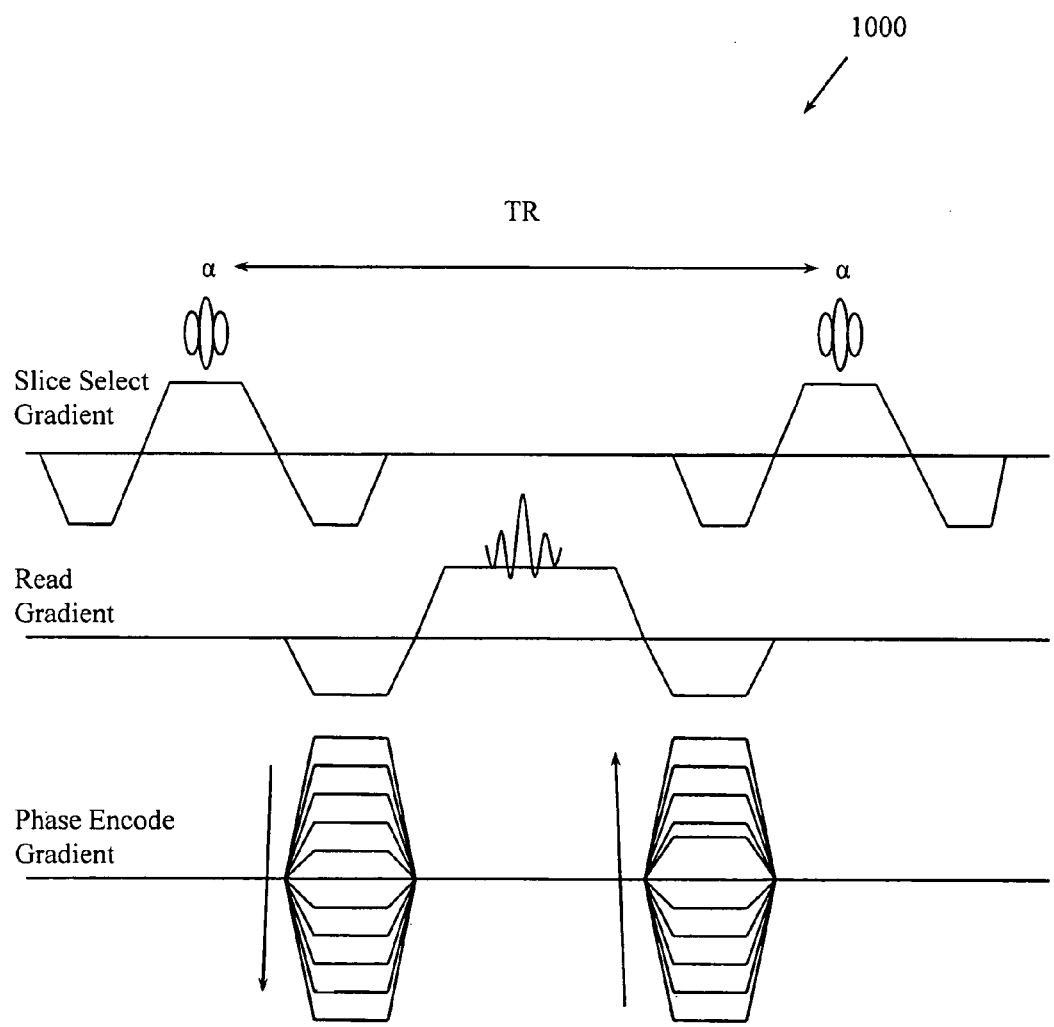
FIG. 10 illustrates an example conventional TrueFISP pulse sequence.
Figure 11:
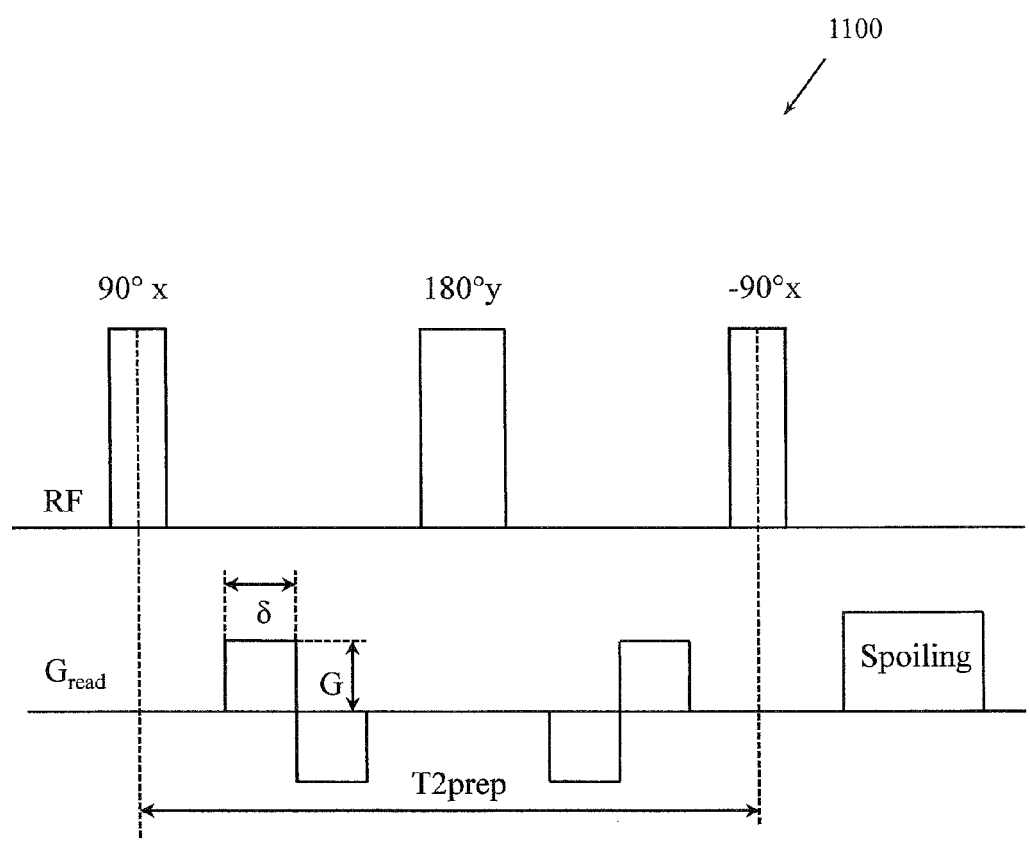
FIG. 11 illustrates an FSD preparation module.

Recall that conventional TrueFISP is a coherent imaging technique that employs a fully balanced gradient waveform. Recall also that TrueFISP builds on FISP, which combined separately observed signals but was missing a spoiler pulse that led to transverse magnetization being present when the next RF pulse is added to the steady state. An example conventional TrueFISP pulse sequence 1000 is provided in FIG. 10. Note that there is no spoiling pulse. Example systems and methods spoil transverse magnetization and perform black blood preparation. Comparing the pulse sequence 1000 in FIG. 10 with the pulse sequence 100 in FIG. 1 illustrates differences between a conventional TrueFISP sequence and a DBbSSFP sequence. Comparing the pulse sequence 1100 in FIG. 11 with the pulse sequence 100 in FIG. 1 illustrates differences between one attempt at flow-sensitizing dephasing-prepared (FSD) bSSFP and the approach described herein.

Figure 2:
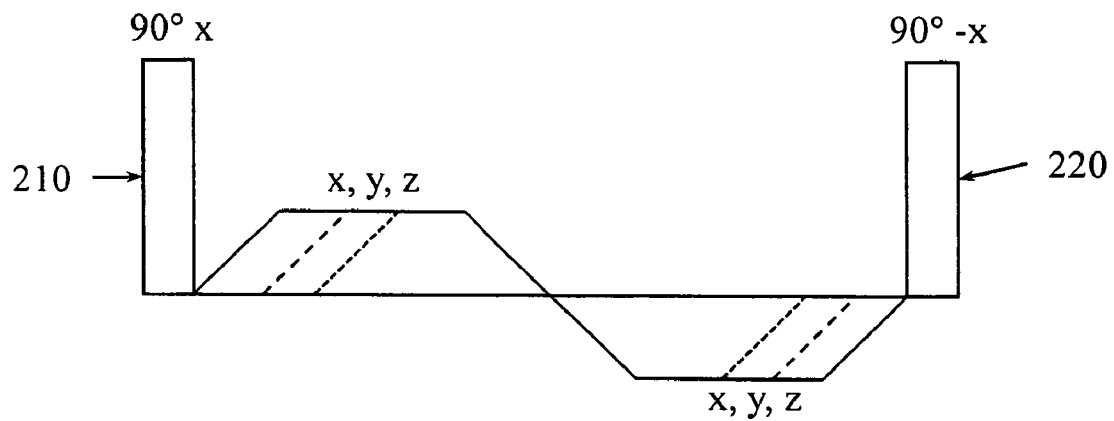
FIG. 2 illustrates an example non-refocused velocity encoding scheme associated with a DBbSSFP sequence.

FIG. 1 illustrates an example dark blood bSSFP sequence 100. One skilled in the art will recognize the portions of sequence 100 that fall within region 130. These include both positive and negative α and α/2 pulses. In addition to the bSSFP portions that fall within region 130, the sequence 100 also includes black blood preparation (BBP) at 110 and spoiling gradient pulses at 120 and 140. The BBP at 110 may include, for example, periodically applying bipolar velocity encoding gradients on different axes. In one example, the BBP at 110 may include non-refocused velocity encoding as demonstrated in FIG. 2. The non-refocused velocity encoding is performed between a ninety degree pulse 210 associated with the x axis and a −90 degree pulse 220 associated with the x axis. While plus and minus 90 degree pulses associated with the x axis are illustrated, one skilled in the art will appreciate that other pulses may be employed. Thus, FIG. 2 illustrates pulses that would be applied during BBP 110 in FIG. 1. Note that x, y, and z axes may be used in the non-refocused velocity encoding.

Figure 3:
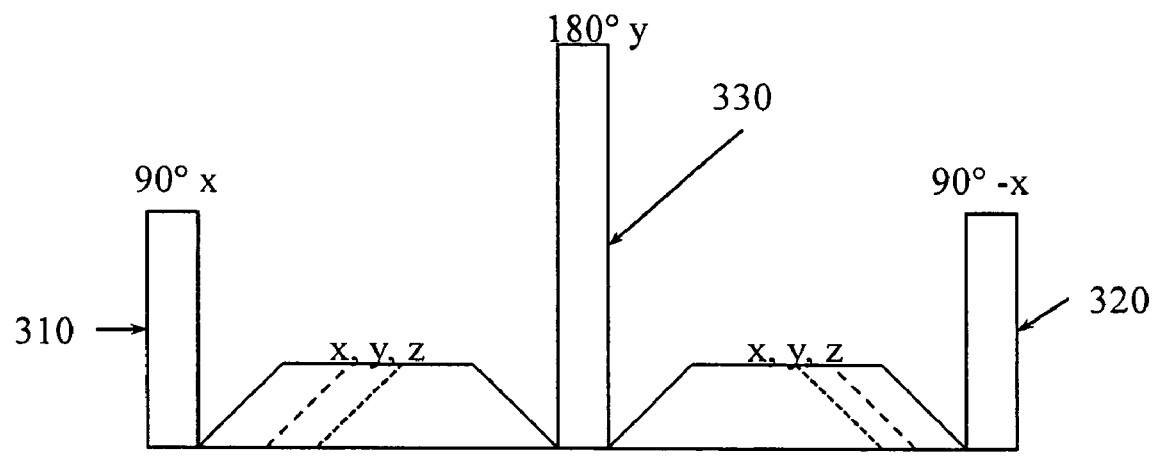
FIG. 3 illustrates an example refocused velocity encoding scheme associated with a DBbSSFP sequence.

In another example, the BBP at 110 may include refocused velocity encoding as demonstrated in FIG. 3. The refocused velocity encoding is performed between a ninety degree pulse 310 associated with the x axis and a −90 degree pulse 320 associated with the x axis. The refocused velocity encoding also includes a middle 180 degree pulse 330 associated with the y axis. While plus and minus 90 degree pulses associated with the x axis are illustrated, and while a 180 degree pulse 330 associated with the y axis are illustrated, one skilled in the art will appreciate that other pulses may be employed. Thus, FIG. 3 illustrates pulses that would be applied during BBP 110 in FIG. 1. Note again that x, y, and z axes may be used in the refocused velocity encoding.

In one example, applied velocity encoding associated with BBP at 110 imparts phase in proportion to the velocity of flowing spins. Differentiating the amount of velocity encoding suppresses different flow velocities. This facilitates improving image quality under a variety of conditions. For example, flow suppression may be provided at different velocity ranges. In one example, flow suppression may be provided for velocity (V) up to 125 cm/s. Flow suppression refers to limiting undesired NMR signal from flowing spins. Thus, in a dark blood technique, NMR signal from spins in flowing blood are suppressed.

Flow suppression may be provided for both on-resonance and off-resonance conditions. In one embodiment, example systems and methods may provide flow suppression of at least 50% for $\pi$ radians off-resonance. In another embodiment, example systems and methods may provide flow suppression of at least 90% for $\pi$ radians off-resonance. In another embodiment, example systems and methods may provide flow suppression of at least 99% for $\pi$ radians off-resonance. In one embodiment, example systems and methods may provide flow suppression of at least 50% for $\pi$ radians on-resonant. In another embodiment, example systems and methods may provide flow suppression of at least 90% for $\pi$ radians on-resonant. In another embodiment, example systems and methods may provide flow suppression of at least 95% for $\pi$ radians on-resonant. In one embodiment, example systems and methods may provide average flow suppression of at least 50% over all de-phasing angles. In another embodiment, example systems and methods may provide average flow suppression of at least 90% over all de-phasing angles. In another embodiment, example systems and methods may provide average flow suppression of at least 95% over all de-phasing angles.

The sequence 100 also includes spoiling residual transverse magnetization at 120 and 140. The spoiler gradients at 120 eliminate the signal from flowing blood remaining in the transverse plane after the $-90°_x$ magnetization preparation pulse (due to the phase accumulated by the flowing spins during the velocity encoding gradients). The spoiler gradients at 140 eliminate any residual magnetization in the transverse plane after the α/2 storage pulse. Removing the residual transverse magnetization improves DBbSSFP by suppressing the flow signal and preventing imaging artifacts; therefore example DBbSSFP MRI spoils that residual transverse magnetization at 120 and 140. One skilled in the art will understand that residual transverse magnetization may be spoiled in different ways.

Thus, example systems and methods suppress signal from flowing spins in a short TR DBbSSFP sequence. The flowing spins would be associated, for example, with blood flowing through a blood vessel, with blood flowing into and out of an organ, and so on. Example systems and methods reduce T2 decay dependant signal loss in stationary spins during velocity encoding. The stationary spins would be those associated with, for example, a blood vessel wall while the flowing spins would be those associated with, for example, blood flowing through that blood vessel. Recall that bSSFP contrast is primarily associated with T2*/T1, and not T1. Therefore, reducing T2 decay dependant signal loss in stationary spins enhances the ability to retrieve and process meaningful signal from those stationary spins. Example systems and methods provide periodic magnetization preparation with differentiated velocity encoding to produce this enhancement. This combination leads to suppressing both through plane and in plane blood flow in TrueFISP. The Differentiated velocity encoding may include progressively reducing the magnitude of flow signal after DB preparations. In order to do this for a range of flow velocities it is necessary to vary the gradient first moment and thus the flow signal phase after the velocity encoding gradient. In one embodiment, this involves randomly varying the gradient first moment over a specified range. In another embodiment, non-random ways to vary the first moment of the gradient to improve the flow spoiling characteristics may be employed.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 4:
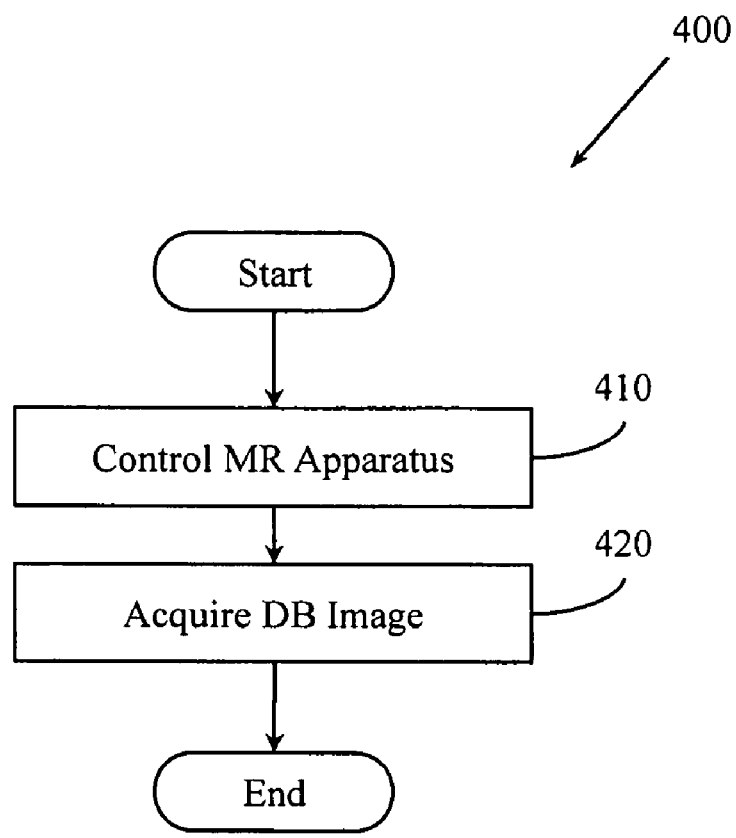
FIG. 4 illustrates an example method associated with DBbSSFP MRI using magnetization prepared differentiated velocity encoding.

FIG. 4 illustrates a method 400 associated with DBbSSFP. Method 400 includes, at 410, controlling an MR apparatus to perform a DBbSSFP imaging technique that includes a black blood preparation phase. In different examples the black blood preparation phase includes non-refocused velocity encoding or refocused velocity encoding. In one example, the TR associated with a DBbSSFP pulse sequence is less than 11 ms. In another example the TR associated with a DBbSSFP pulse sequence is less than 8 ms.

Method 400 also includes, at 420, acquiring a dark blood image in response to the DBbSSFP imaging technique controlled at 410. The DBbSSFP imaging technique provides flow suppression at a velocity of up to 125 cm/s and may provide configurable flow suppression. In one example, the DBbSSFP imaging technique provides at least 90% flow suppression for $\pi$ radians off-resonance, provides at least 90% flow suppression for $\pi$ radians on-resonant, and provides an average 90% flow suppression over all dephasing angles. Additionally, the DBbSSFP imaging technique provides 20% reduction of on-resonance spin signal for stationary spins.

In one example, method 400 may be a computer-implemented method. Method 400 may include, at 410, controlling an MRI apparatus to apply magnetic fields and/or RF pulses to an object to be imaged. The magnetic fields and RF pulses are configured to produce dark blood balanced steady state free precession (DBbSSFP) magnetic resonance imaging (MRI). Some of the RF and gradient pulses are organized into a magnetization preparation with differentiated velocity encoding module and other RF and/or gradient pulses are organized into a residual transverse magnetization spoiling module. The controlling at 410 may include controlling the MRI apparatus to periodically store bSSFP magnetization along the z-axis using an $\alpha/2$ pulse.

Method 400 also includes, at 420, controlling the MRI apparatus to acquire an image in response to the DBbSSFP imaging. The object to be imaged by method 400 may include both flowing spins and non-flowing spins. Therefore, that NMR signal received from the object to be imaged may include NMR signal from flowing spins and NMR signal from non-flowing spins. Therefore, the magnetic fields and RF pulses are configured to yield a situation where the NMR signal from flowing spins appears in a desired ratio with respect to NMR signal from non-flowing spins.

The desired ratio may be satisfied under different conditions. In one example, the desired ratio is satisfied when at least 90% of NMR signal from flowing spins for π radians off-resonance is suppressed. In another example, the desired ratio is satisfied when at least 90% of NMR signal from flowing spins for π radians on-resonant is suppressed. In yet another example, the desired ratio is satisfied when on average 90% of NMR signal from flowing spins over all dephasing angles is suppressed.

In one example, controlling the MRI apparatus to perform the magnetization preparation with differentiated velocity encoding phase comprises controlling the MRI apparatus to periodically apply bipolar velocity encoding gradients on different axes. The differentiated velocity encoding may be performed in different manners. In one example, the differentiated velocity encoding is non-refocused velocity encoding, while in another example, the differentiated velocity encoding is refocused velocity encoding. The velocity encoding may be proportional to velocity. Therefore, in one example, controlling the MRI apparatus to perform the magnetization preparation with differentiated velocity encoding phase may include controlling the MRI apparatus to apply phase encoding pulses configured to impart phase in proportion to the velocity of the flowing spins. The flowing spins may be moving up to 125 cm/s in some examples.

In one example, controlling the MRI apparatus at 410 to perform the residual transverse magnetization spoiling phase includes controlling the MRI apparatus to apply, per TR, a first spoiling gradient pulse before bSSFP pulses in the TR and a second spoiling gradient pulse after bSSFP pulses in the TR.

While FIG. 4 illustrates various actions occurring in serial, it is to be appreciated that various actions illustrated in FIG. 4 could occur substantially in parallel. By way of illustration, a first process could control an MR apparatus to produce DBbSSFP pulse sequences and a second process could acquire NMR signal associated with producing a DB image in response to the DBbSSFP sequences. While two processes are described, it is to be appreciated that a greater and/or lesser number of processes could be employed and that lightweight processes, regular processes, threads, and other approaches could be employed.

Figure 5:
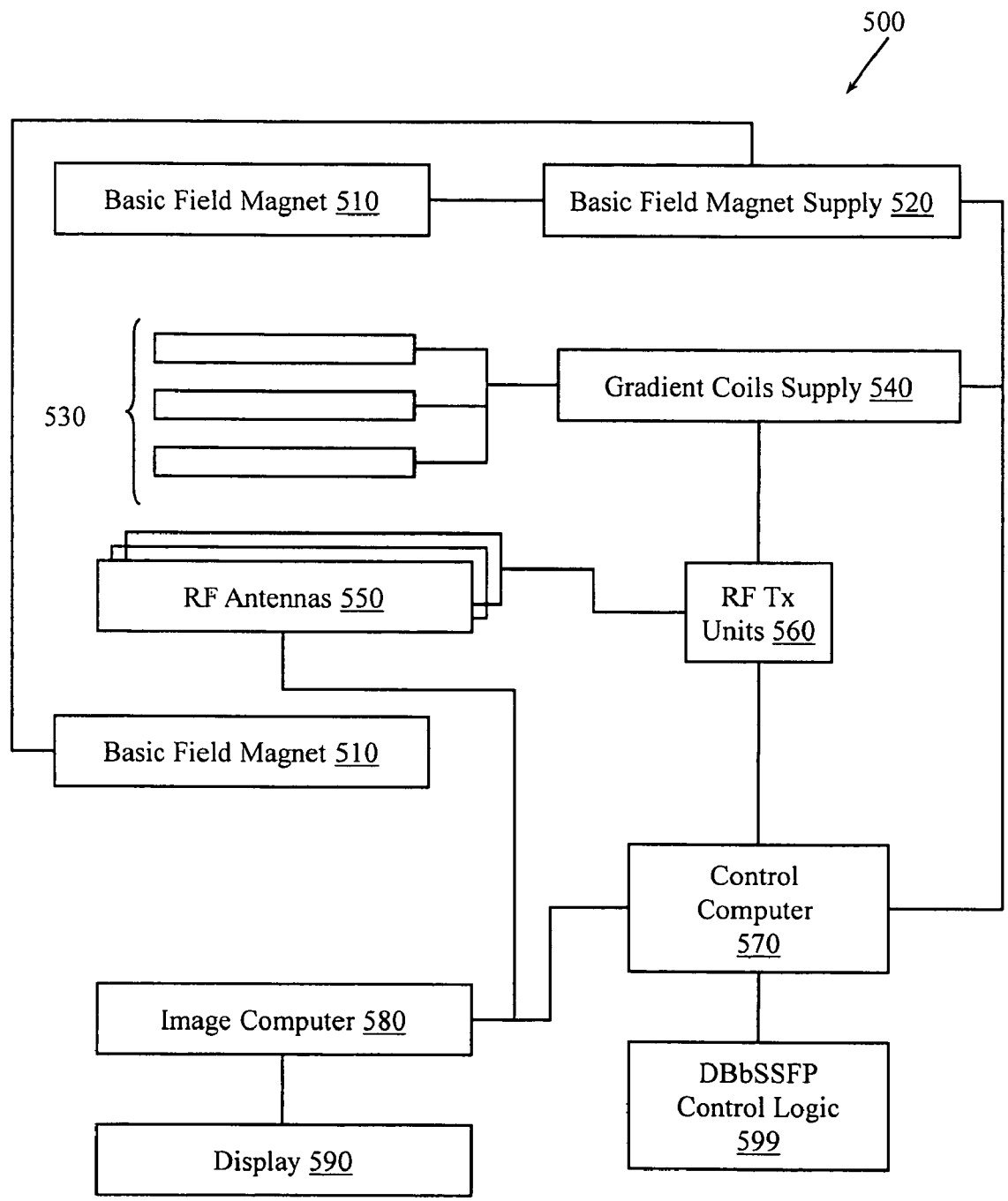
FIG. 5 illustrates an MRI apparatus associated with suppressing signal from flowing spins in a short TR bSSFP sequence.

FIG. 5 illustrates an example MRI apparatus 500 configured with a DBbSSFP control logic 599 to facilitate controlling MRI apparatus 500 to perform a DBbSSFP imaging technique that includes dark blood preparation and spoiling residual transverse magnetization. The dark blood preparation may include, for example, non-refocused velocity encoding, focused velocity encoding, and so on. Thus, MRI apparatus 500 provides means to acquire an MR image that depends, at least in part, on a DBbSSFP imaging scheme that includes magnetization prepared differentiated velocity encoding.

The apparatus 500 includes a basic field magnet(s) 510 and a basic field magnet supply 520. Ideally, the basic field magnets 510 would produce a uniform $B_0$ field. However, in practice, the $B_0$ field may not be uniform, and may vary over an object being imaged by the MRI apparatus 500. MRI apparatus 500 may include gradient coils 530 configured to emit gradient magnetic fields like $G_S$, $G_P$ and $G_R$. The gradient coils 530 may be controlled, at least in part, by a gradient coils supply 540. In some examples, the timing, strength, and orientation of the gradient magnetic fields may be controlled, and thus selectively adapted during an MRI procedure.

MRI apparatus 500 may include a set of RF antennas 550 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 550 may be controlled, at least in part, by a set of RF transmission units 560. An RF transmission unit 560 may provide a signal to an RF antenna 550.

The gradient coils supply 540 and the RF transmission units 560 may be controlled, at least in part, by a control computer 570. The magnetic resonance signals received from the RF antennas 550 can be employed to generate an image and thus may be subject to a transformation process like a two dimensional FFT that generates pixilated image data. The transformation can be performed by an image computer 580 or other similar processing device. The image data may then be shown on a display 590. While FIG. 5 illustrates an example MRI apparatus 500 that includes various components connected in various ways, it is to be appreciated that other MRI apparatus may include other components connected in other ways.

Figure 6:
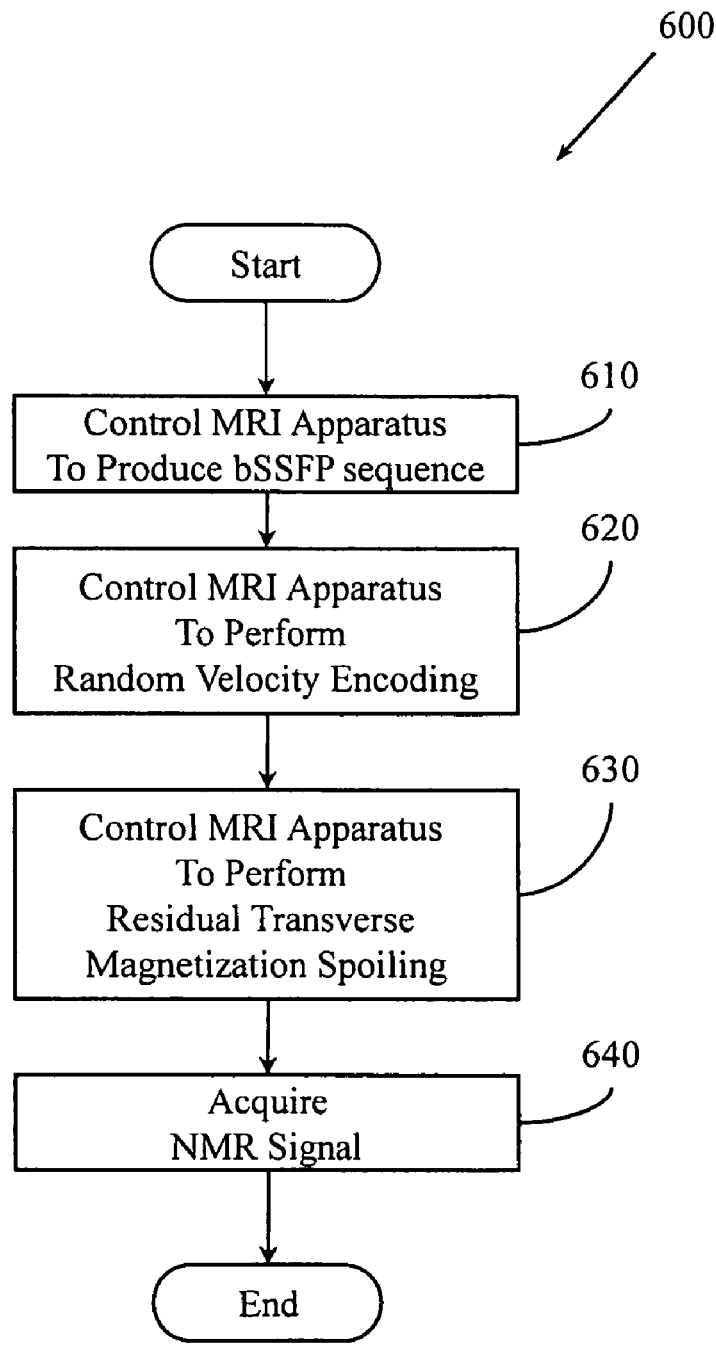
FIG. 6 illustrates an example method associated with DBbSSFP MRI using magnetization prepared differentiated velocity encoding and a spoiling gradient pulse.

FIG. 6 illustrates an example method 600. Method 600 is associated with DBbSSFP MRI using magnetization prepared differentiated velocity encoding and a spoiling gradient pulse. Method 600 includes, at 610, controlling an MRI apparatus to produce a bSSFP sequence. The bSSFP sequence is to be applied to an object having flowing spins and non-flowing spins. The flowing spins may include through plane flowing spins and in plane flowing spins.

Method 600 also includes, at 620, controlling the MRI apparatus to perform differentiated velocity encoding based periodic magnetization preparation in association with the bSSFP sequence. The velocity encoding based periodic magnetization preparation may be similar to that described elsewhere herein.

Method 600 also includes, at 630, controlling the MRI apparatus to perform residual transverse magnetization spoiling in association with the bSSFP sequence. The residual transverse magnetization spoiling may also be similar to that described elsewhere herein.

Method 600 also includes, at 640, acquiring an NMR signal from the object. Since the object has both flowing spins and non-flowing spins, NMR signal from the object may include NMR signal from the flowing spins and NMR signal from the non-flowing spins. Due to the careful crafting of the magnetic fields and RF pulses associated with the DBbSSFP pulse sequence, the NMR signal from flowing spins appears in a desired ratio with respect to NMR signal from non-flowing spins. In one example the desired ratio is achieved when at least 95% of the NMR signal is attributable to non-flowing spins and less than 5% of the NMR signal is attributable to flowing spins.

Figure 7:
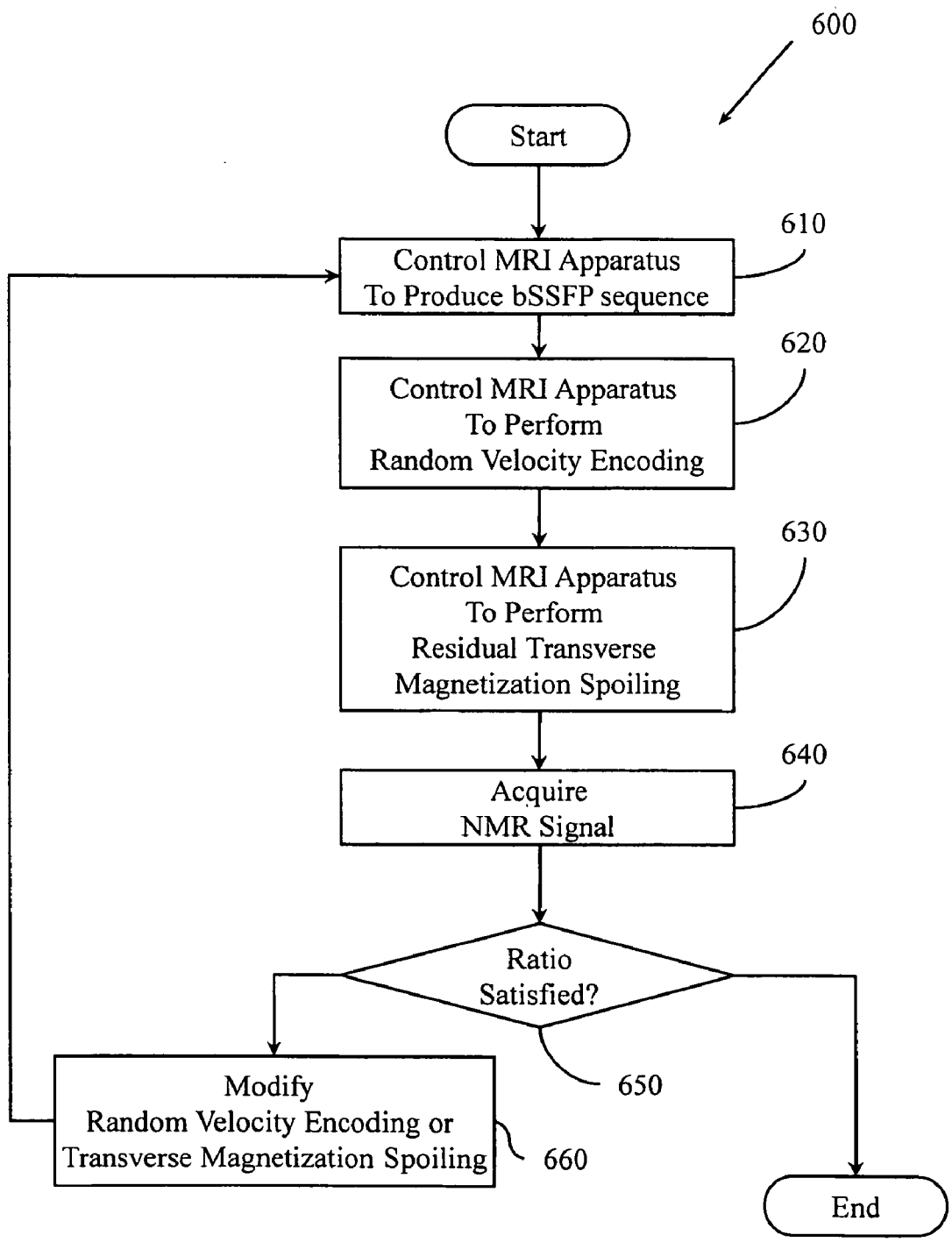
FIG. 7 illustrates an example method associated with DBbSSFP MRI using magnetization prepared differentiated velocity encoding and a spoiling gradient pulse.

FIG. 7 illustrates another embodiment of method 600. This embodiment of method 600 includes a calibration phase. At 650, a determination is made concerning whether the desired suppression ratio has been satisfied. If the determination at 650 is Yes, then method 600 can conclude. If the determination at 650 is No, then method 600 may include, at 660, selectively modifying the differentiated velocity encoding based periodic magnetization preparation or the transverse magnetization spoiling. Method 600 may return to 610 to acquire a DB image with better suppression.

Figure 8:
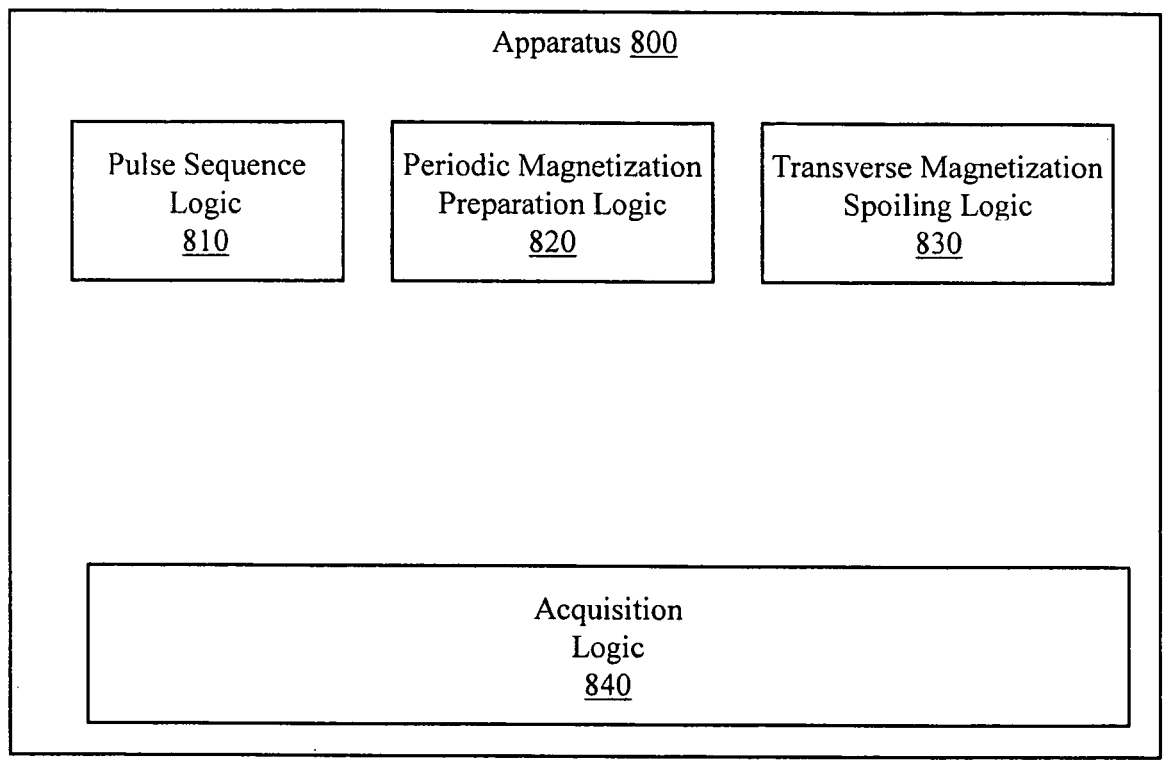
FIG. 8 illustrates an example apparatus associated with DBbSSFP MRI using magnetization prepared differentiated velocity encoding and a spoiling gradient pulse.

FIG. 8 illustrates an apparatus 800. Apparatus 800 is associated with DBbSSFP MRI using magnetization prepared differentiated velocity encoding and a spoiling gradient pulse. Apparatus 800 includes a pulse sequence logic 810. Pulse sequence logic 810 is configured to apply a bSSFP pulse sequence to an object having flowing spins and non-flowing spins. An example pulse sequence is provided in FIG. 1. The flowing spins may include through plane flowing spins and in plane flowing spins.

Apparatus 800 also includes a periodic magnetization preparation logic 820. Preparation logic 820 is configured to perform differentiated velocity encoding by periodically applying bipolar velocity encoding gradients on different axes. The differentiated velocity encoding may be refocused or non-refocused velocity encoding as illustrated in FIGS. 2 and 3. In one example, the periodic magnetization preparation logic 820 is configured to apply phase encoding pulses configured to impart phase in proportion to the velocity of the flowing spins. The object to be imaged may include spins flowing at up to 125 cm/s.

Apparatus 800 also includes a transverse magnetization spoiling logic 830. Spoiling logic 830 is configured to mitigate residual transverse magnetization produced as a result of the bSSFP pulse sequence. Apparatus 800 also includes an acquisition logic 840. Acquisition logic 840 is configured to acquire an NMR signal from the object in response to the bSSFP pulse sequence, the differentiated velocity encoding, and the transverse magnetization mitigation. The NMR signal may include NMR signal from flowing spins and NMR signal from non-flowing spins. The pulse sequence logic 810, the periodic magnetization preparation logic 820, and the transverse magnetization spoiling logic 830 are configured to produce conditions in the object to be image so that NMR signal from flowing spins appears in a desired ratio with respect to NMR signal from non-flowing spins. In one example, the desired ratio requires at least 90% suppression of NMR signal from flowing spins for $\pi$ radians off-resonance, at least 90% suppression of NMR signal from flowing spins for $\pi$ radians on-resonant, and an average 90% suppression of NMR signal from flowing spins over all de-phasing angles.

Figure 9:
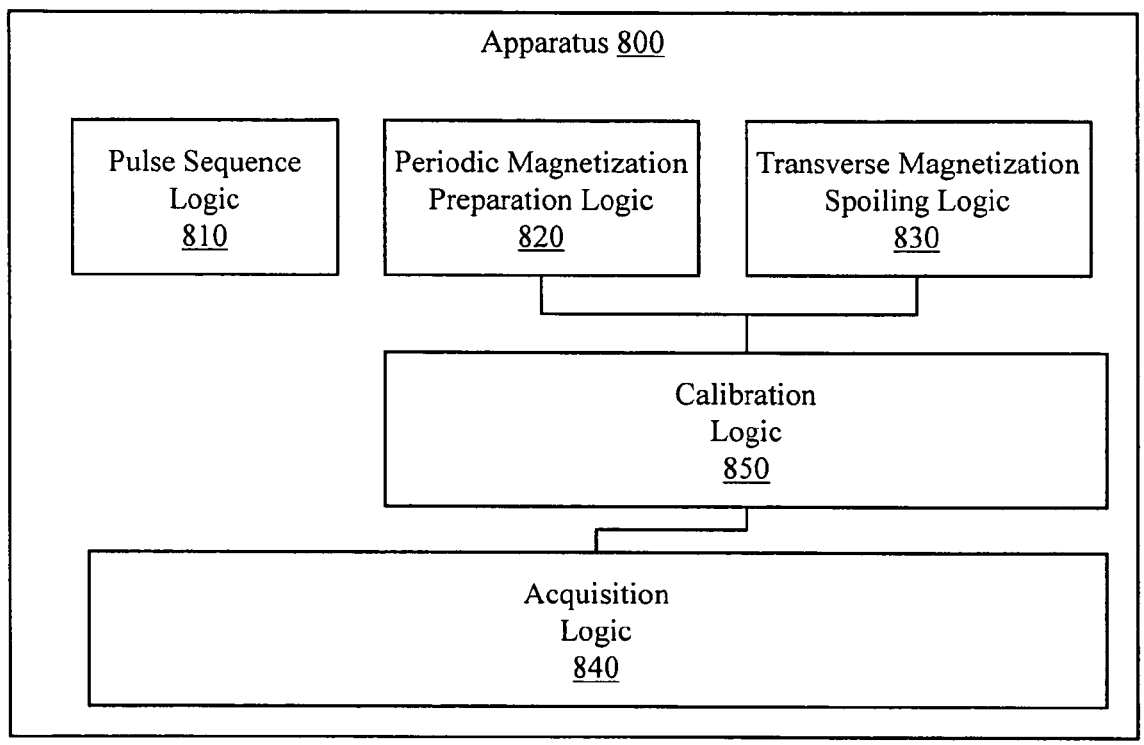
FIG. 9 illustrates an example apparatus associated with DBbSSFP MRI using magnetization prepared differentiated velocity encoding and a spoiling gradient pulse.

FIG. 9 illustrates another embodiment of apparatus 800. This embodiment of apparatus 800 includes a calibration logic 850. Calibration logic 850 is configured to selectively modify the differentiated velocity encoding based periodic magnetization preparation or the transverse magnetization spoiling in response to determining that NMR signal from flowing spins in the object does not appear in the desired ratio with respect to NMR signal from non-flowing spins in the object. For example, calibration logic 850 may switch the differentiated velocity encoding from focused to non-refocused, may change the amplitude of a spoiling gradient pulse, and so on.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A computer-implemented method, comprising:
   controlling a magnetic resonance imaging (MRI) apparatus to apply, to an object to be imaged, one or more of, magnetic fields, and radio frequency (RF) pulses, where the magnetic fields and RF pulses are associated with dark blood balanced steady state free precession (DBbSSFP) magnetic resonance imaging (MRI),
   where the object to be imaged comprises flowing spins and non-flowing spins, and
   where RF pulses are organized into a magnetization preparation with differentiated velocity encoding phase and a residual transverse magnetization spoiling phase; and
   controlling the MRI apparatus to acquire an image in response to the DBbSSFP imaging, where nuclear magnetic resonance (NMR) signal received from the object to be imaged includes NMR signal from flowing spins and NMR signal from non-flowing spins, where the NMR signal from flowing spins appears in a desired ratio with respect to NMR signal from non-flowing spins.

2. The computer-implemented method of claim 1, comprising controlling the MRI apparatus to periodically store bSSFP magnetization along the z-axis using an $\alpha/2$ pulse.

3. The computer-implemented method of claim 1, where controlling the MRI apparatus to perform the magnetization preparation with differentiated velocity encoding phase comprises controlling the MRI apparatus to periodically apply bipolar velocity encoding gradients on different axes.

4. The computer-implemented method of claim 3, where the differentiated velocity encoding is non-refocused velocity encoding.

5. The computer-implemented method of claim 3, where the differentiated velocity encoding is refocused velocity encoding.

6. The computer-implemented method of claim 3, where controlling the MRI apparatus to perform the magnetization preparation with differentiated velocity encoding phase comprises controlling the MRI apparatus to apply phase encoding pulses configured to impart phase in proportion to the velocity of the flowing spins.

7. The computer-implemented method of claim 3, where a TR associated with a DBbSSFP pulse sequence is less than 11 ms.

8. The computer-implemented method of claim 3, where the object to be imaged includes flowing spins flowing at up to 125 cm/s.

9. The computer-implemented method of claim 3, where the desired ratio is satisfied when at least 90% of NMR signal from flowing spins for $\pi$ radians off-resonance is suppressed.

10. The computer-implemented method of claim 3, where the desired ratio is satisfied when at least 90% of NMR signal from flowing spins for $\pi$ radians on-resonant is suppressed.

11. The computer-implemented method of claim 3, where the desired ratio is satisfied when on average 90% of NMR signal from flowing spins over all de-phasing angles is suppressed.

12. The computer-implemented method of claim 3, where controlling the MRI apparatus to perform the residual transverse magnetization spoiling phase comprises controlling the MRI apparatus to apply, per TR, a first spoiling gradient pulse before bSSFP pulses in the TR and a second spoiling gradient pulse after bSSFP pulses in the TR.

13. The computer-implemented method of claim 1, where the object to be imaged includes in plane flowing spins and through plane flowing spins, where the desired ratio is maintained for in plane flowing spins, and where the desired ratio is maintained for through plane flowing spins.

14. A computer-readable medium storing computer-executable instructions that when executed by a computer cause the computer to perform a method, the method comprising:
    controlling an MRI apparatus to produce a bSSFP sequence, where the bSSFP sequence is to be applied to an object having flowing spins and non-flowing spins, where the flowing spins include through plane flowing spins and in plane flowing spins;
    controlling the MRI apparatus to perform differentiated velocity encoding based periodic magnetization preparation in association with the bSSFP sequence;
    controlling the MRI apparatus to perform residual transverse magnetization spoiling in association with the bSSFP sequence; and
    acquiring an NMR signal from the object, where the NMR signal includes NMR signal from flowing spins and NMR signal from non-flowing spins, where the NMR signal from flowing spins appears in a desired ratio with respect to NMR signal from non-flowing spins.

15. The computer-readable medium of claim 14, where the TR for the bSSFP sequence is less than 11 ms.

16. The computer-readable medium of claim 15, where the desired ratio is achieved when at least 95% of the NMR signal is attributable to non-flowing spins and less than 5% of the NMR signal is attributable to flowing spins.

17. The computer-readable medium of claim 16, where the differentiated velocity encoding is non-refocused velocity encoding.

18. The computer-readable medium of claim 17, the method comprising:
    in response to acquiring the NMR signal from the object and determining that NMR signal from flowing spins does not appear in a desired ratio with respect to NMR signal from non-flowing spins, selectively modifying one or more of, the differentiated velocity encoding based periodic magnetization preparation, and the transverse magnetization spoiling.

* * * * *